(12) United States Patent
Hormati et al.

(10) Patent No.: US 10,347,283 B2
(45) Date of Patent: Jul. 9, 2019

(54) CLOCK DATA RECOVERY IN MULTILANE DATA RECEIVER

(71) Applicant: KANDOU LABS, S.A., Lausanne (CH)

(72) Inventors: Ali Hormati, Ecublens (CH); Armin Tajalli, Chavannes près Renens (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/802,365

(22) Filed: Nov. 2, 2017

(65) Prior Publication Data
US 2019/0130942 A1 May 2, 2019

(51) Int. Cl.
| | | |
|---|---|---|
| G11B 20/10 | (2006.01) |
| H04L 7/033 | (2006.01) |
| H03L 7/099 | (2006.01) |
| G06F 15/82 | (2006.01) |
| H03L 7/085 | (2006.01) |
| G06F 13/40 | (2006.01) |

(52) U.S. Cl.
CPC ........ *G11B 20/10398* (2013.01); *G06F 15/82* (2013.01); *H03L 7/099* (2013.01); *H04L 7/0331* (2013.01); *G06F 13/4063* (2013.01); *H03L 7/085* (2013.01)

(58) Field of Classification Search
CPC ... H03L 7/0992; H03L 7/0994; H03L 7/0998; H03L 7/099; H03L 7/085; G11B 20/10398; G06F 15/82; G06F 13/4063; H04L 7/0331
See application file for complete search history.

(56) References Cited

U.S. PATENT DOCUMENTS

| | | | |
|---|---|---|---|
| 5,150,384 A * | 9/1992 | Cahill | H04B 1/10 329/360 |
| 5,266,907 A | 11/1993 | Dacus | |
| 5,528,198 A | 6/1996 | Baba | |
| 5,629,651 A | 5/1997 | Mizuno | |
| 5,802,356 A | 9/1998 | Gaskins | |
| 6,307,906 B1 * | 10/2001 | Tanji | H03D 13/004 375/375 |

(Continued)

FOREIGN PATENT DOCUMENTS

CN 203675093 U 6/2014

OTHER PUBLICATIONS

Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.

*Primary Examiner* — Sophia Vlahos
(74) *Attorney, Agent, or Firm* — Invention Mine LLC

(57) ABSTRACT

Methods and systems are described for obtaining, at a phase-error aggregator, a plurality of data-derived phase-error signals for two or more data lanes of a multi-wire bus, each data-derived phase-error signal generated using at least (i) a phase of one or more phases of a local oscillator signal and (ii) a corresponding data signal associated with one of the two or more data lanes, generating a composite phase-error signal representing a combination of the two or more obtained data-derived phase-error signals, receiving the composite phase-error signal at a loop filter responsively generating an oscillator control signal, and receiving the oscillator control signal at a local oscillator and responsively adjusting a timing of the local oscillator to adjust the one or more phases of the local oscillator signal.

16 Claims, 19 Drawing Sheets

(56) References Cited

U.S. PATENT DOCUMENTS

| | | |
|---|---|---|
| 6,316,987 B1 | 11/2001 | Dally |
| 6,380,783 B1 | 4/2002 | Chao et al. |
| 6,389,091 B1 | 5/2002 | Yamaguchi |
| 6,509,773 B2 | 1/2003 | Buchwald et al. |
| 6,717,478 B1 | 4/2004 | Kim |
| 7,199,728 B2 | 4/2007 | Dally |
| 7,336,112 B1 | 2/2008 | Sha |
| 7,535,957 B2 | 5/2009 | Ozawa |
| 7,616,075 B2 | 11/2009 | Kushiyama |
| 7,650,525 B1 | 1/2010 | Chang |
| 7,688,929 B2 | 3/2010 | Co |
| 7,860,190 B2 * | 12/2010 | Feller .................. H03L 7/07 375/326 |
| 8,036,300 B2 | 10/2011 | Evans |
| 8,253,454 B2 | 8/2012 | Lin |
| 8,791,735 B1 | 7/2014 | Shibasaki |
| 9,036,764 B1 | 5/2015 | Hossain |
| 9,059,816 B1 | 6/2015 | Simpson |
| 9,148,198 B1 | 9/2015 | Zhang |
| 9,306,621 B2 | 4/2016 | Zhang |
| 9,374,250 B1 * | 6/2016 | Musah ................. H04L 7/0058 |
| 9,520,883 B2 | 12/2016 | Shibasaki |
| 9,565,036 B2 | 2/2017 | Zerbe |
| 9,906,358 B1 | 2/2018 | Tajalli |
| 10,055,372 B2 | 8/2018 | Shokrollahi |
| 2003/0146783 A1 | 8/2003 | Bandy |
| 2004/0092240 A1 * | 5/2004 | Hayashi ............. H04L 27/2275 455/214 |
| 2005/0024117 A1 * | 2/2005 | Kubo .................... H03K 5/133 327/258 |
| 2005/0128018 A1 | 6/2005 | Meltzer |
| 2005/0220182 A1 | 10/2005 | Kuwata |
| 2005/0275470 A1 | 12/2005 | Choi |
| 2006/0140324 A1 | 6/2006 | Casper |
| 2006/0232461 A1 | 10/2006 | Felder |
| 2006/0233291 A1 | 10/2006 | Garlepp |
| 2007/0001713 A1 * | 1/2007 | Lin ...................... H03D 13/004 327/3 |
| 2007/0001723 A1 | 1/2007 | Lin |
| 2007/0201597 A1 | 8/2007 | He |
| 2008/0007367 A1 | 1/2008 | Kim |
| 2008/0317188 A1 | 12/2008 | Staszewski |
| 2009/0195281 A1 | 8/2009 | Tamura |
| 2009/0262876 A1 | 10/2009 | Arima |
| 2010/0180143 A1 | 7/2010 | Ware |
| 2010/0220828 A1 | 9/2010 | Fuller |
| 2011/0156757 A1 | 6/2011 | Hayashi |
| 2012/0327993 A1 | 12/2012 | Palmer |
| 2013/0088274 A1 | 4/2013 | Gu |
| 2013/0271194 A1 | 10/2013 | Pellerano |
| 2013/0285720 A1 * | 10/2013 | Jibry ..................... H03L 7/06 327/156 |
| 2013/0314142 A1 | 11/2013 | Tamura |
| 2014/0286381 A1 | 9/2014 | Shibasaki |
| 2015/0078495 A1 * | 3/2015 | Hossain ............... H04L 7/033 375/346 |
| 2015/0117579 A1 | 4/2015 | Shibasaki |
| 2015/0180642 A1 | 6/2015 | Hsieh |
| 2015/0236885 A1 * | 8/2015 | Ling .................. H04L 27/2627 375/340 |
| 2015/0256326 A1 | 9/2015 | Simpson |
| 2017/0310456 A1 | 10/2017 | Tajalli |

\* cited by examiner

CLOCK DATA RECOVERY IN MULTILANE DATA RECEIVER

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III").

U.S. patent application Ser. No. 13/176,657, filed Jul. 5, 2011, naming Harm Cronie and Amin Shokrollahi, entitled "Methods and Systems for Low-power and Pin-efficient Communications with Superposition Signaling Codes" (hereinafter "Cronie IV").

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

U.S. Provisional Patent Application No. 62/288,717, filed Apr. 22, 2016, naming Armin Tajalli, entitled "High Performance Phase Locked Loop", hereinafter identified as [Tajalli IV].

U.S. patent application Ser. No. 15/582,545, filed Apr. 28, 2017, naming Ali Hormati and Richard Simpson, entitled "Clock Data Recovery Utilizing Decision Feedback Equalization", hereinafter identified as [Hormati I].

U.S. patent application Ser. No. 15/602,080, filed May 22, 2017, naming Ali Hormati, entitled "Data-Driven Phase Detector Element for Phase Locked Loops," hereinafter identified as [Hormati II].

The following additional references to prior art have been cited in this application:

U.S. Pat. No. 6,509,773, filed Apr. 30, 2001 by Buchwald et al., entitled "Phase interpolator device and method" (hereafter called [Buchwald].

"Linear phase detection using two-phase latch", A. Tajalli, et al., IEE Electronic Letters, 2003, (hereafter called [Tajalli V].)

"A Low-Jitter Low-Phase-Noise 10-GHz Sub-Harmonically Injection-Locked PLL With Self-Aligned DLL in 65-nm CMOS Technology", Hong-Yeh Chang, Yen-Liang Yeh, Yu-Cheng Liu, Meng-Han Li, and Kevin Chen, IEEE Transactions on Microwave Theory and Techniques, Vol 62, No. 3, March 2014 pp. 543-555, (hereafter called [Chang et al.])

"Low Phase Noise 77-GHz Fractional-N PLL with DLL-based Reference Frequency Multiplier for FMCW Radars", Herman Jalli Ng, Rainer Stuhlberger, Linus Maurer, Thomas Sailer, and Andreas Stelzer, Proceedings of the 6th European Microwave Integrated Circuits Conference, 10-11 Oct. 2011, pp. 196-199, (hereafter called [Ng et al.])

"Design of Noise-Robust Clock and Data Recovery using an Adaptive-Bandwidth Mixed PLL/DLL", Han-Yuan Tan, Doctoral Thesis, Harvard University November 2006, (hereafter called [Tan]).

U.S. Pat. No. 7,492,850, filed Aug. 31, 2005 by Christian Ivo Menolfi and Thomas Helmut Toifl, entitled "Phase locked loop apparatus with adjustable phase shift" (hereafter called [Menolfi].)

"A Calibration-Free Fractional-N Ring PLL Using Hybrid Phase/Current-Mode Phase Interpolation Method", by Romesh Kumar Nandwana et al, IEEE Journal of Solid-State Circuits Vol. 50, No. 4, April 2015, ppg. 882-895, (hereafter called [Nandwana].)

FIELD OF THE INVENTION

The present embodiments relate to communications systems circuits generally, and more particularly to obtaining a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a data lane, a channel, or a link and multiple data lanes create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device are sampled (or their signal value otherwise recorded) at intervals best representing the original transmitted values, regardless of transmission channel delays, interference, and noise. This Clock and Data Recovery (CDR) not only determines the appropriate sample timing, but continues to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

To reliably detect the data values transmitted over a communications system, a receiver accurately measures the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream.

In general, the receiver embodiments of such timing methods are described as Clock-Data Recovery (CDR), often based on Phase-Lock Loop (PLL) or Delay-Locked Loop (DLL) synthesis of a local receive clock having the desired frequency and phase characteristics.

In some communications systems, multiple data lanes may be received originating from a single transmitter or multiple transmitters utilizing coordinated transmission clocks. In such isochronous or plesiochronous environments, CDR phase errors detected at one receive data lane input may suggest corrections that are also applicable at other receive data lane inputs derived from the same clock source.

Methods and systems are described for obtaining, at a phase-error aggregator, a plurality of data-derived phase-error signals for two or more data lanes of a multi-wire bus, each data-derived phase-error signal generated using at least (i) a phase of one or more phases of a local oscillator signal and (ii) a corresponding data signal associated with one of the two or more data lanes, generating a composite phase-error signal representing a combination of the two or more obtained data-derived phase-error signals, receiving the composite phase-error signal at a loop filter responsively generating an oscillator control signal; and receiving the oscillator control signal at a local oscillator and responsively adjusting a timing of the local oscillator to adjust the one or more phases of the local oscillator signal.

DETAILED DESCRIPTION

Figure 1:
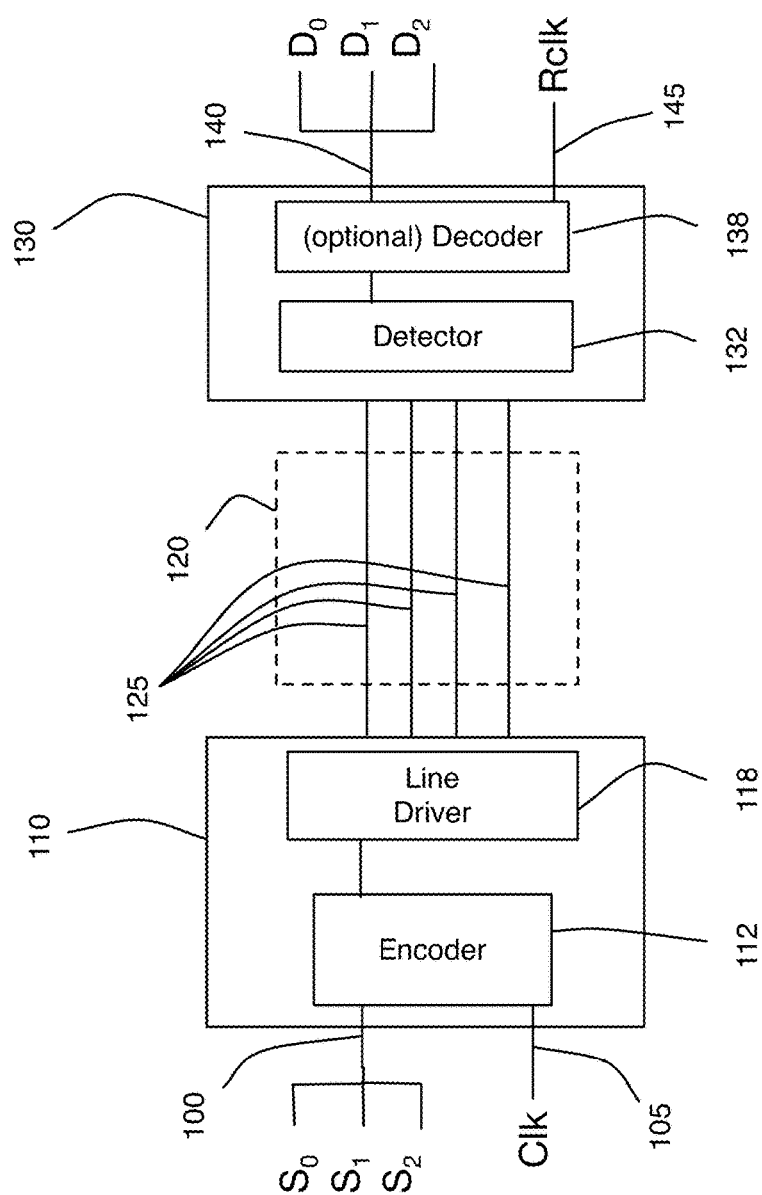
FIG. 1 is a block diagram of a communications system, used in accordance with some embodiments.

As illustrated by the embodiment of FIG. 1, transmitting device 110 communicates with receiving device 130 over multiple data communications channels 125 sharing communications medium 120. Depending on the particular coding scheme used, the number of data lanes comprising a communications link may range from two to eight or more, and may also communicate one or more clock signals on separate communications channels. Each data lane may represent a distinct physical interconnection such as one or more wires of a parallel communications bus, or may be a virtual communications entity, such as a subchannel of an Orthogonal Differential Vector Signaling (ODVS) code, as described in [Cronie I], [Cronie II], [Cronie III] and [Cronie IV].

Without implying limitation, the example communication link 120 in FIG. 1 is illustrated as being composed of four wires 125, collectively communicating data values 100 between transmitter 110 and receiver 130 using clock signal Clk 105. An encoder 112 is shown, which may perform differential encoding on the input data values 100, or other types of encoding methods such as those described in [Cronie I]. The signals are then sent over communication link via line driver 118. The signals received at receiver 130 may then be detected 132 and decoded 138 in some embodiments to produce output values 140 and a received clock 145. In practice, the four wires 125 may be configured as two differential wire pairs, sufficient to communicate two data bits. As taught by [Cronie I], the four wires 125 may alternatively communicate three data bits encoded using the H4 code it describes.

It should be noted that in some embodiments transmitter 110 will use a single clock source as the time base for generation of each output signal it sends over wires 125. In most chip-to-chip communication environments, the propagation characteristics of communications medium 120 are relatively consistent, thus in such systems the multiple received signals at receiver 125 will generally remain relatively well correlated in timing, albeit with tractable variations in arrival time (e.g. skew and jitter.) In such systems, the CDA component of signal detection within receiver 125 may be considered as having two distinct aspects; first, synthesis of a stable local clock equivalent to the clock source within transmitter 110 and second, derivation of individual sampling times from that local clock to accurately capture the value of each received signal input.

One familiar with the art will recognize that this receive timing model may not apply in environments where communications medium 120 introduces significant and rapidly-varying perturbations into the transmission line characteristics of wires 125. One obvious example is multichannel wireless communication, where the propagation time, signal strength, and noise characteristics of different channels or paths may vary widely and independently change at a rapid rate. In such environments, known art solutions include individual CDA subsystems for each receive signal, comprising voltage-controlled oscillator (VCO), phase detector, and other phase-locked loop (PLL) elements.

Some known art chip-to-chip communications receivers also incorporate individual CDA phase-locked loops per signal input as an implementation convenience, maintaining multiple PLL VCOs operating at different phase offsets to produce the necessary sampling clocks, rather than one PLL VCO clock which then undergoes phase adjustment for each receive input sampler. However, at high clock speeds the power requirement for these duplicated PLLs may become a significant component of overall receiver power consumption.

Figure 2:
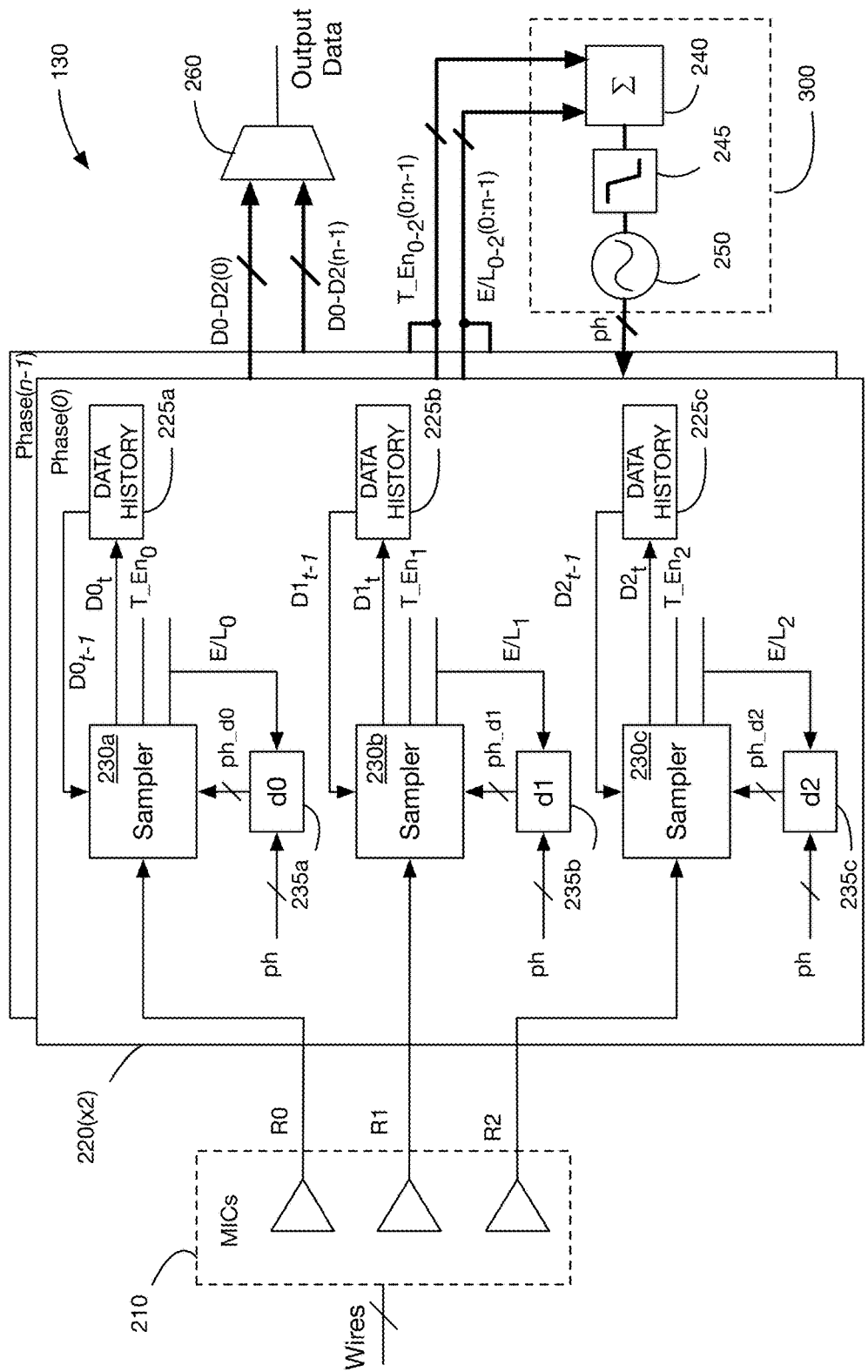
FIG. 2 is a block diagram of a data-driven phase aggregation processing phase, in accordance with some embodiments.

One typical high-speed receiver embodiment is illustrated in FIG. 2. It operates on three received data signals R0, R1, R2, which in this particular example are obtained as a result of processing of received ODVS encoded wire signals in three Multi-Input Comparators (MIC) 210 as taught in [Holden I] and [Ulrich I].

Figure 15:
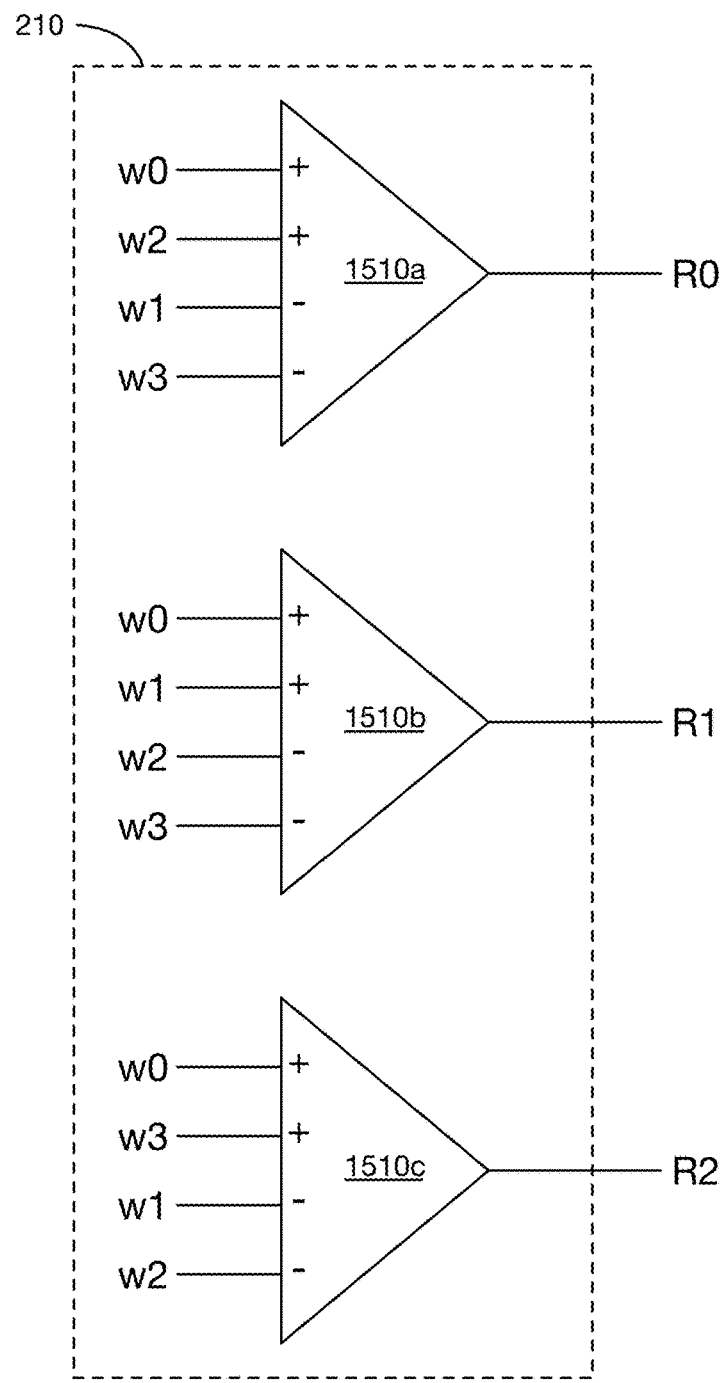
FIG. 15 is a block diagram of an ensemble non-return-to-zero (ENRZ) receiver, in accordance with some embodiments.
Figure 16:
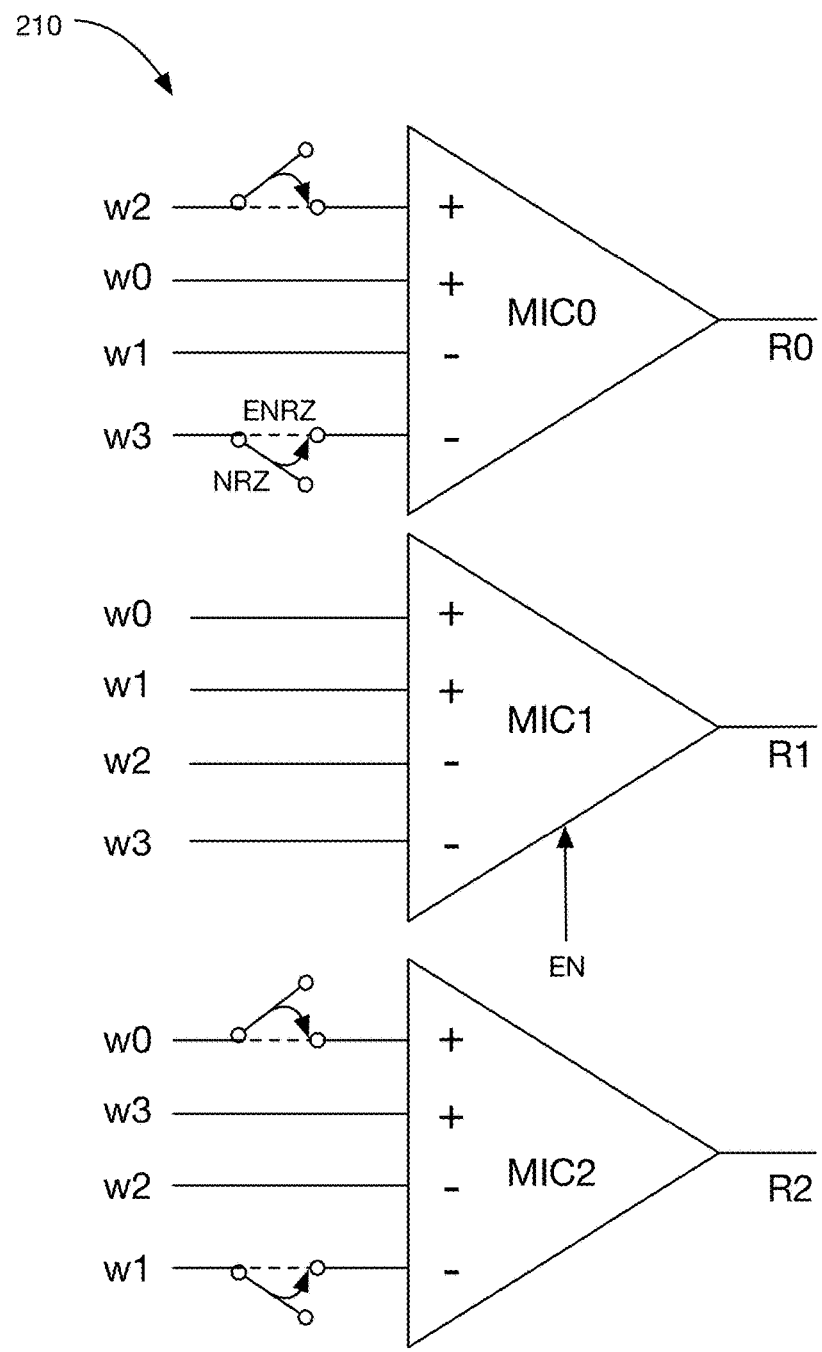
FIG. 16 is a block diagram of a multi-mode ENRZ/NRZ receiver, in accordance with some embodiments.
Figure 17A:
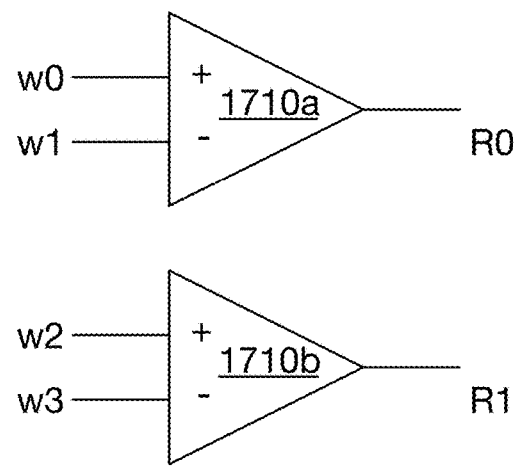
FIG. 17A is a block diagram of two data lanes taking the form of signals received as differential signals, in accordance with some embodiments.
Figure 17B:
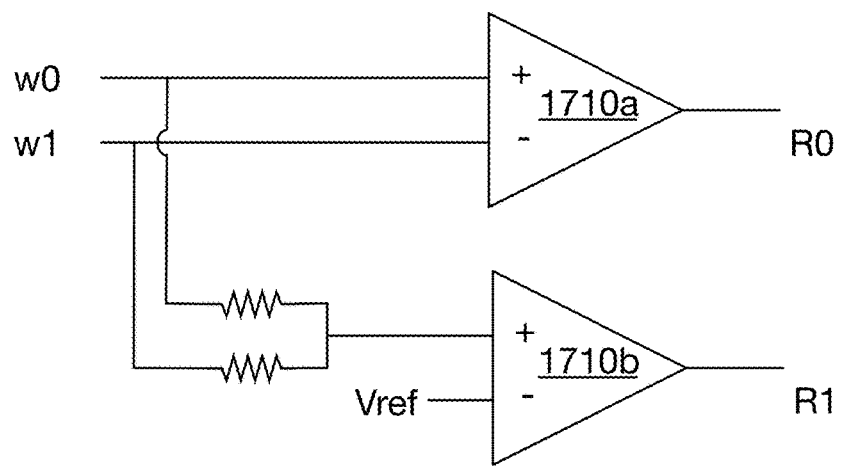
FIG. 17B is a block diagram is a block diagram of two data lanes; one of which takes the form of a differential signal and the other takes the form of a common mode signal, in accordance with some embodiments.

Representative examples of MIC embodiments detecting the H4 or ENRZ code are shown in FIG. 15. A further embodiment also configurable of detecting legacy differential pair signals is shown in FIG. 16. FIG. 17A illustrates a pair of conventional differential line receivers detecting legacy differential pair signals, while FIG. 17B illustrates a pair of conventional differential receivers detecting a differential signal and an independent common mode signal carried by the same wire pair.

Each received data signal is sampled 230a, 230b, 230c, at a time determined to maximize the quality of the detected data (e.g. at the "center of open eye") producing data values D0, D1, D2. As these samples occur in successive receive unit intervals, specific instances are identified in FIG. 2 with time series nomenclature (e.g. $D0_{t-1}$ etc.) In cases where a data value changes in consecutive receive unit intervals, samplers can also provide indications of whether such transitions occurred before or after the expected time.

As shown, the receiver of FIG. 2 may incorporate Decision Feedback Equalization (DFE), which uses information about previously received data to compensate for residual network perturbations affecting subsequent data transmissions. Data History 225a, 225b, 225c stores instances of past received data, producing compensative values $D0_{t-1}$, $D1_{t-1}$, $D2_{t-1}$ to adjust the sampling threshold used by Samplers 230a, 230b, 230c respectively.

[Hormati I] teaches that the combination of high speed data samplers and at least one stage of loop-unrolled or predictive DFE can be utilized to efficiently detect both a received data value and a CDR timing phase error sample. In such a so-called baud rate CDR, differences in a sampler output in consecutive sampling intervals can be used as an indicator that the sample timing is earlier or later than optimum. These data-derived phase-error signals (composed in FIG. 2 of transition indication signals $T\_En_{0-2}(0:n-1)$ and early-late indication signals $E/L_{0-2}(0:n-1)$) are provided to CDA subsystem 300 to facilitate correction of both overall clock timing and sample timing for each individual data stream. It should be noted that in some embodiments utilizing a known test pattern, the transition indication signals may not be used as transitions are known to occur. Alternatively, if transition densities are sufficient in the information, "false updates" (e.g., transition did not occur) may average out to be 0, while "true updates" (e.g., transition did occur) perform the CDR. In embodiments performing CDR during random data, transition indication signals may be useful to only update the local oscillator when a transition is detected.

Figure 5:
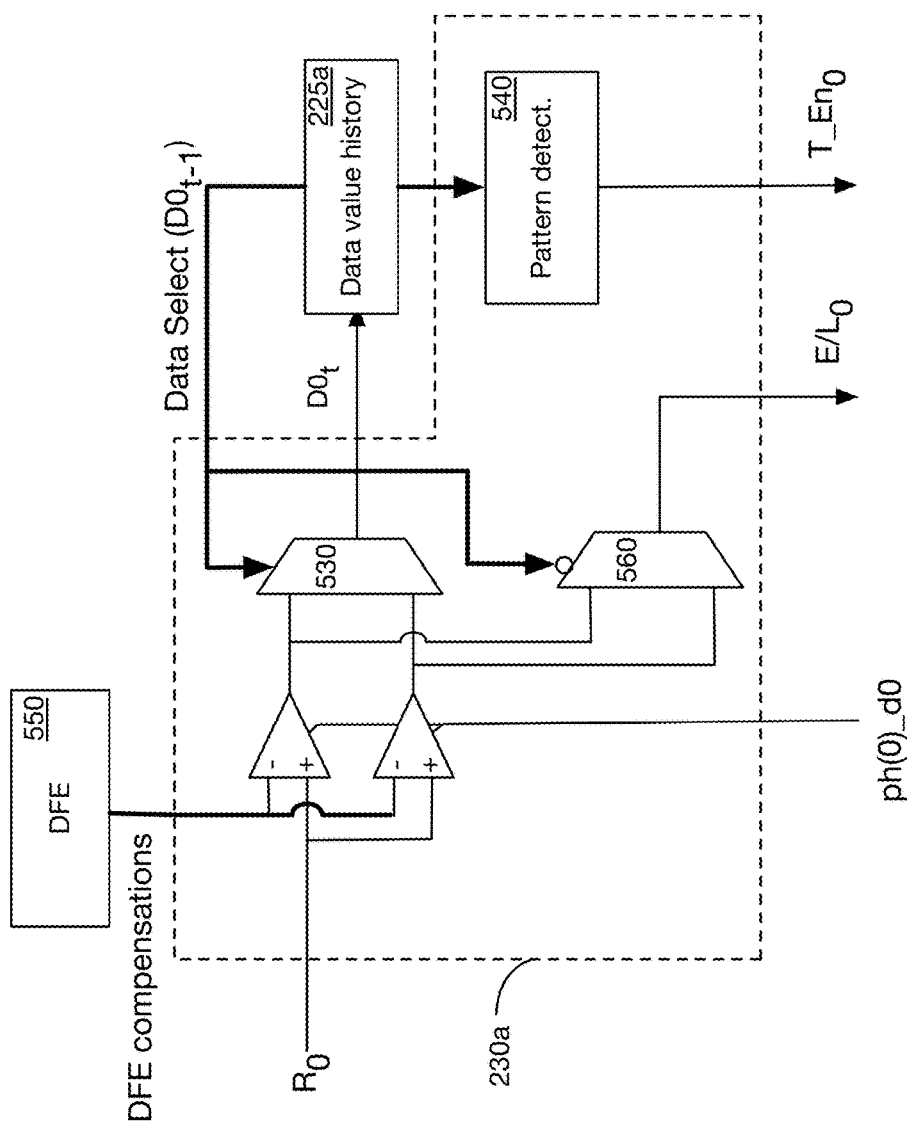
FIG. 5 is a block diagram of a sampler for generating a data-derived phase-error signal based on decision feedback equalization, in accordance with some embodiments.

One such embodiment is shown in FIG. 5 where a predictive DFE provides two speculative offset or threshold values, one associated with a historical data '1' value in a preceding receive unit interval t−1, and the other with a historical data '0' value in that same preceding unit interval t−1. Sampling clock ph(0)_d0 may trigger sampling of input signal $R_0$ before the received data value for the preceding unit interval has been determined. When the correct received data value for the preceding receive unit interval is resolved by data value history 225a, mux 530 may be used to select the appropriate sampler result as the detected data $D_{0t}$ at unit interval t. As described by [Hormati I], the other sampled result may provide indication of whether a transition of input signal $R_0$ occurred earlier or later than sampling clock ph(0)_d0. The resulting early/late signal $E/L_0$ provides this information to the CDR subsystem, while pattern detector 540 uses the criteria described in [Hormati I] to identify data sequences (e.g. transitions) for which the $E/L_0$ output is significant. In at least one embodiment, an XOR gate suffices to detect differences between a current data sample and a previous data sample constituting a suitable transition pattern.

Figure 6:
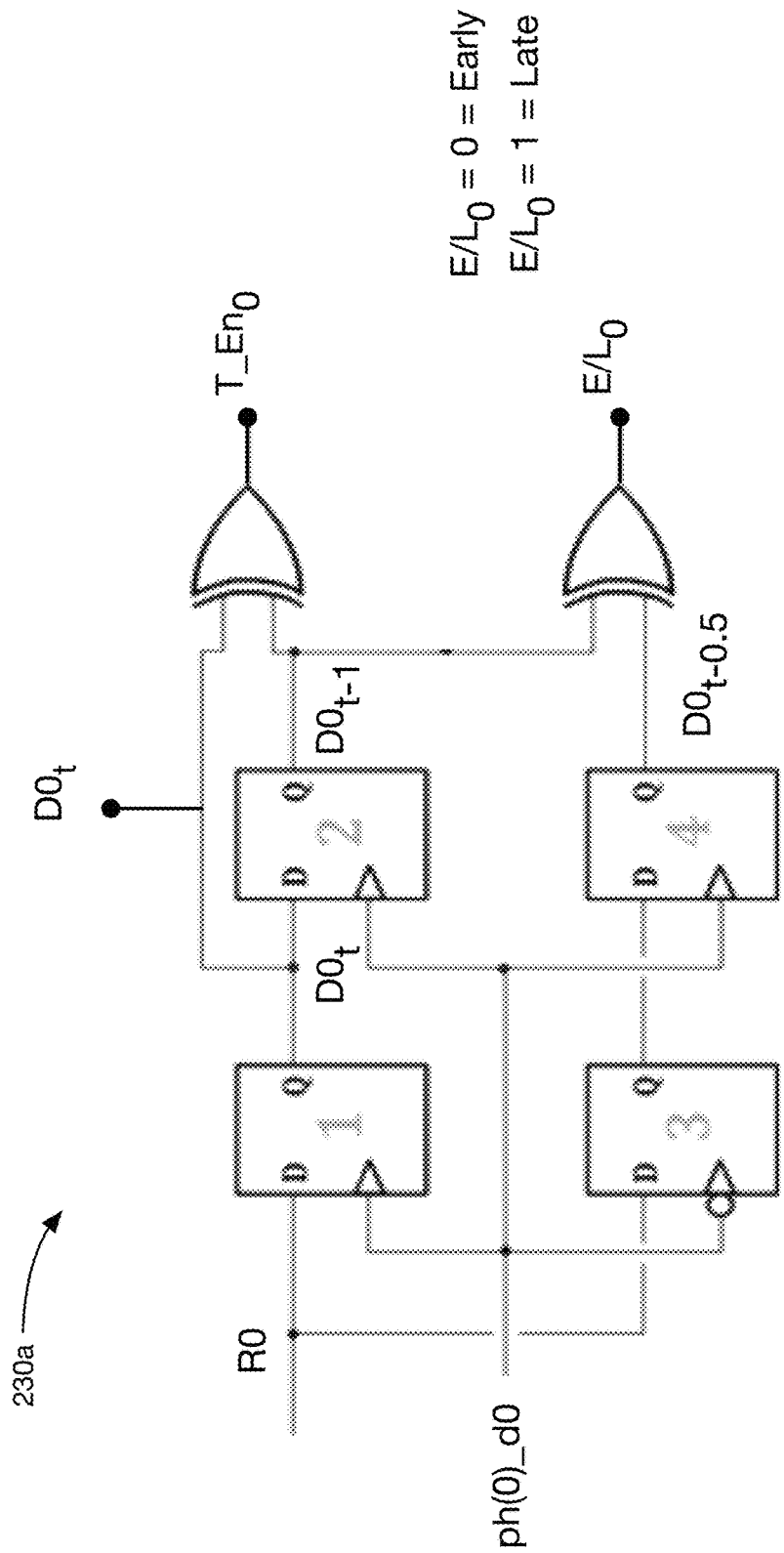
FIG. 6 is a block diagram of a baud-rate bang-bang phase detector for generating a data-derived phase-error signal, in accordance with some embodiments.
Figure 7:
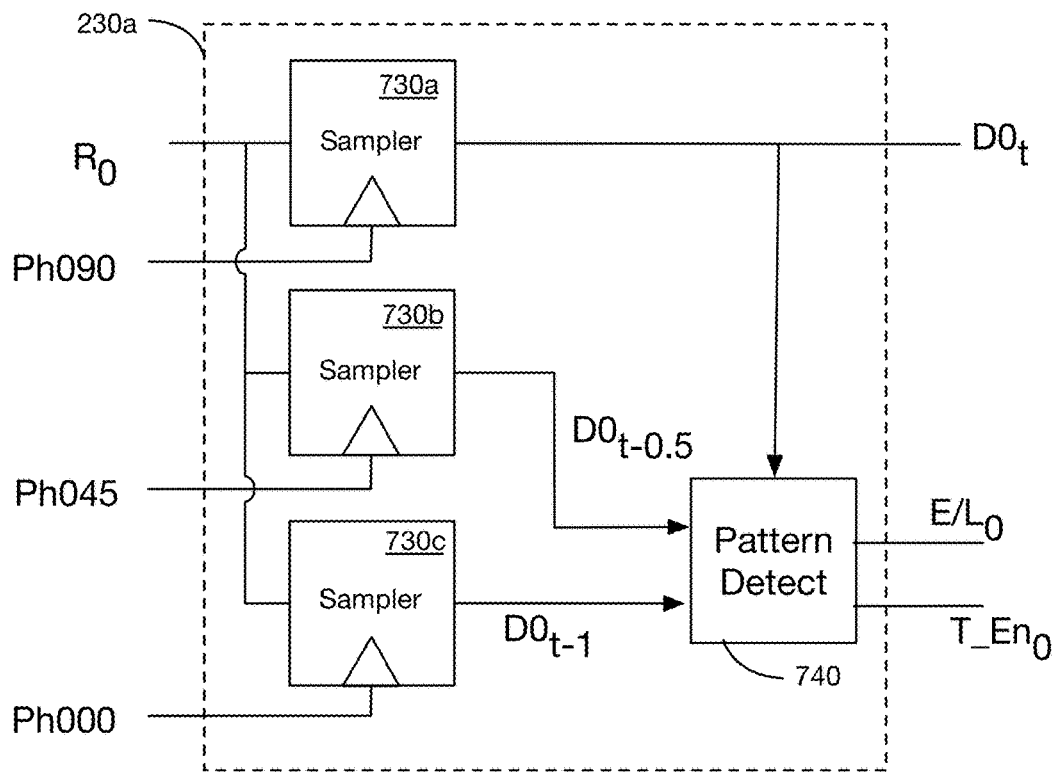
FIG. 7 is a block diagram of a sampler performing oversampling to generate a data-derived phase-error signal, in accordance with some embodiments.
Figure 7:
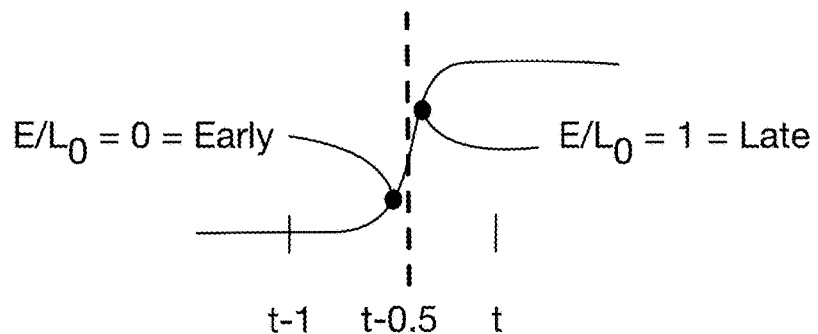
Figure 8:
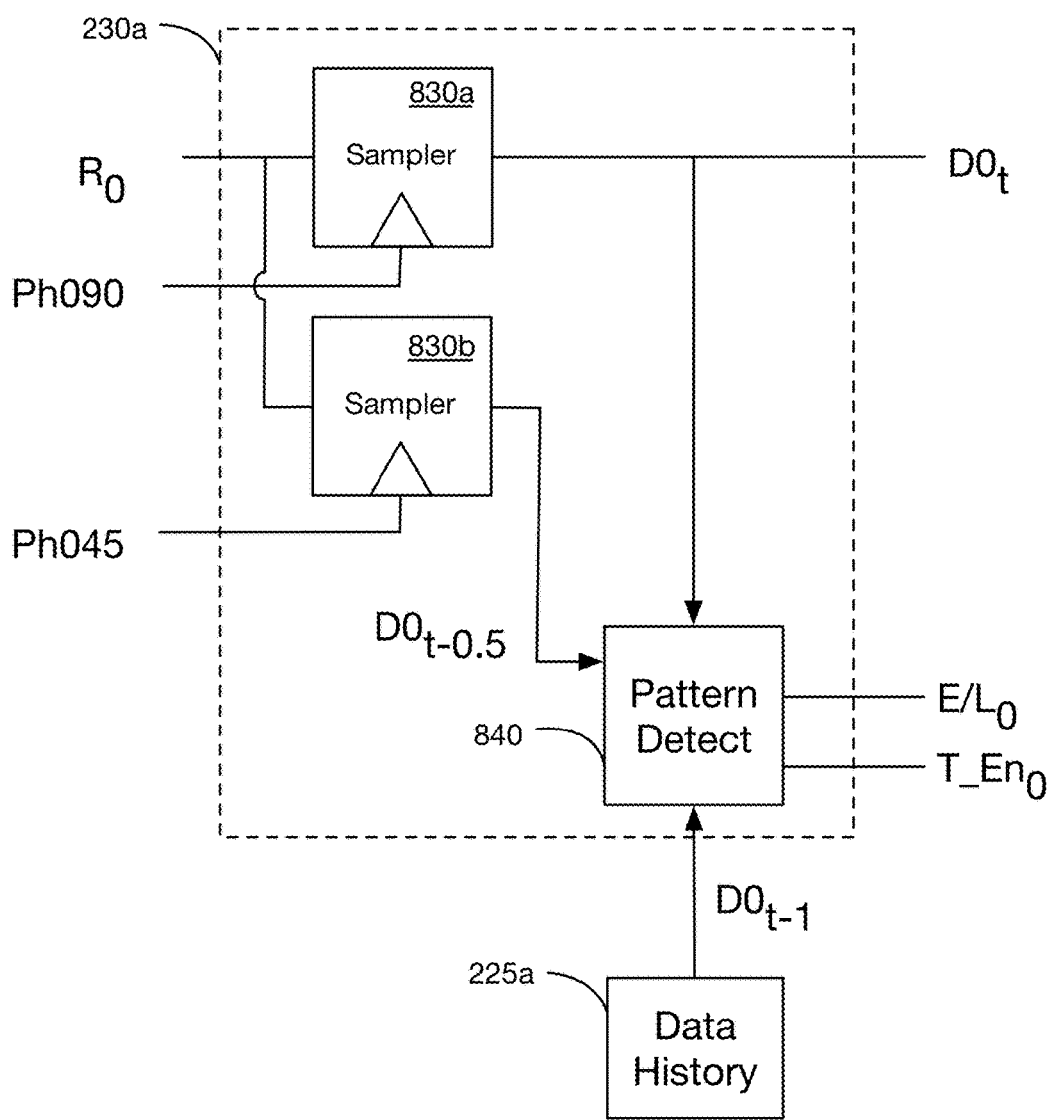
FIG. 8 is a block diagram of a sampler performing oversampling and obtaining a previous data sample to generate a data-derived phase-error signal, in accordance with some embodiments.

FIG. 6 shows one embodiment of a digital sampler and "bang-bang" phase detector configured to receive an input data signal and one phase of the local oscillator signal, and to responsively generate the corresponding data-derived phase-error signal. FIG. 7 shows an embodiment operating at a higher sampling rate (i.e. utilizing a plurality of the phases of the local oscillator signal) and configured to generate at least one data sample at time t and an edge sample at time t−0.5, where t−0.5 corresponds to a half unit interval prior to time t. The sampler responsively generates the data-derived phase-error signal. FIG. 8 is similar to the embodiment shown in FIG. 7, however FIG. 8 further incorporates Data History 225a, which may be a data history storage element providing historical data samples corresponding to a previous receive unit interval t−1 of the input signal. In some embodiments, historical data samples may be obtained from data captured by a sampler of a parallel processing phase operating on the received data signal.

The receiver of FIG. 2 utilizes multiple essentially parallel data sampling instances 220 to facilitate high-speed data reception. In the illustrated example, two such instances are shown, each processing alternate receive unit intervals at half rate, the results of which are subsequently combined 260 to produce a full-rate Output Data stream. It should be noted that additional or fewer parallel processing phases may be present.

Concurrently, CDA subsystem 300 utilizes data-derived phase-error information $T\_En_{0-2}(0:n-1)$ and $E/L_{0-2}(0:n-1)$ to maintain phase lock of local oscillator 250, which through phase interpolators 390 and/or delay elements 235a, 235b, and 235c controls the sample timing of Samplers 230a, 230b, 230c.

Figure 3:
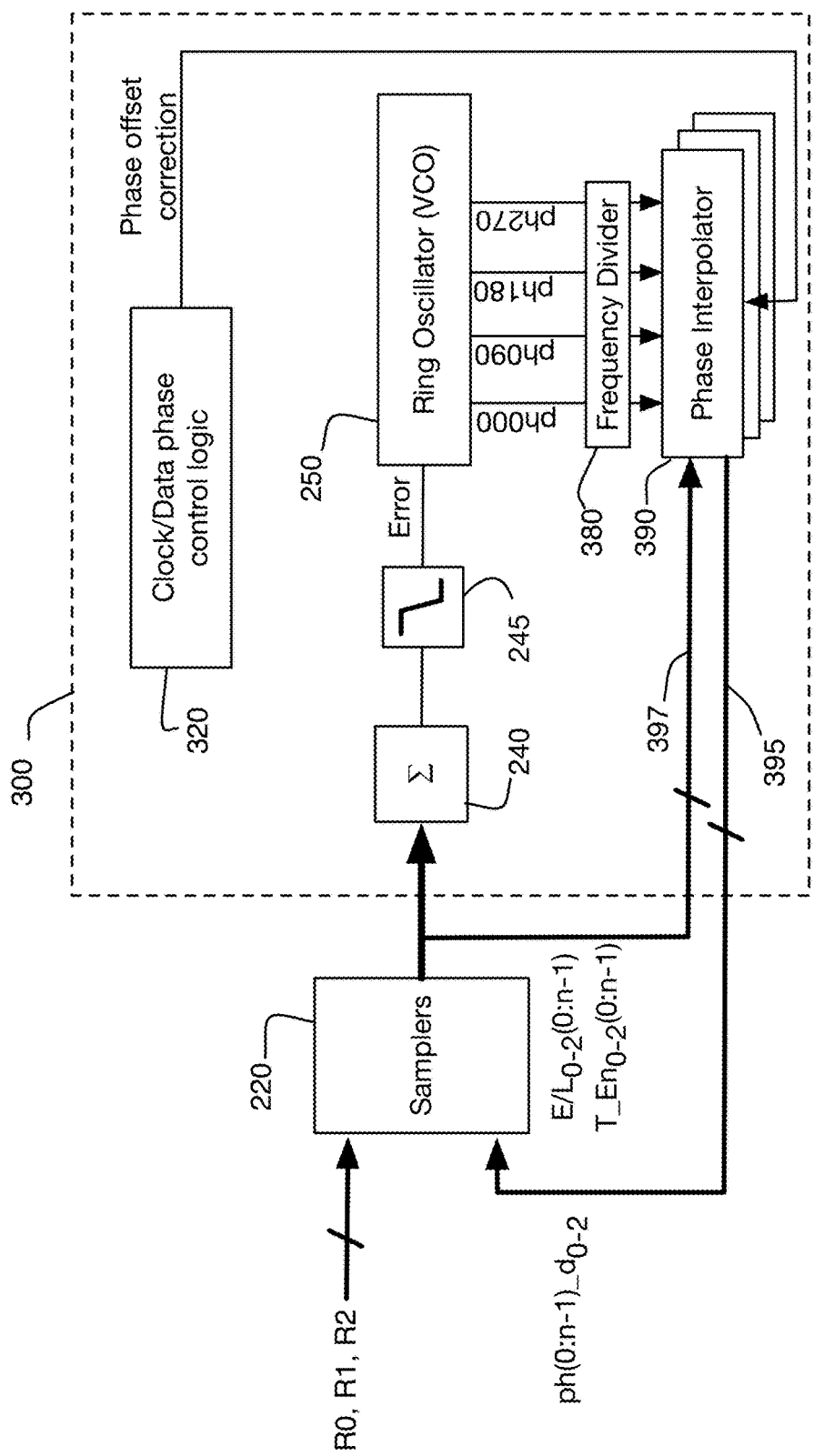
FIG. 3 is a block diagram of a clock recovery circuit, in accordance with some embodiments.

FIG. 3 is a block diagram emphasizing the internals of CDA subsystem 300 for the receiver as illustrated in FIG. 2, in accordance with some embodiments. As is typical in a Phase Locked Loop system, a Ring Oscillator 250 functioning as a Voltage Controlled Oscillator (VCO) produces local clocks (ph000, ph090, ph180, ph270) which may optionally be reduced in frequency by Frequency Divider 380. One or more instances of Phase Interpolators 390 act upon the multiple phases of local clocks (as well as the data-derived phase-error information received from samplers in phases 220) to synthesize phase adjusted sampling clocks ph(0:n−1)_$d_{0-2}$. In such embodiments, the notation '_dn' corresponds to the sampling clock phases having corresponding data lane-specific delays applied to the sampling clock phases.

Each instance of Phase Interpolator 390 is configured to produce phase-adjusted (according to the data lane-specific delay values) sampling clocks suitable for triggering the samplers for one data lane in each parallel data sampling instance. Each instance of Phase Interpolators 390 may be configured independently by control logic 320, thus allowing the sample timing for one data lane, for example data lane-specific delay value d0, to be adjusted to be earlier or later than the sample timing for another data lane, for example data lane-specific delay value d1. Aggregators (storage elements maintaining a cumulative record over multiple input instances) are used to analyze data-derived phase-error signals (and in some embodiments, additionally analyze transitions used to verify data-derived phase-error signals are valid,) to determine whether or not the average error is 0 for a given sub-channel. If a particular average or aggregated error is non-zero, the subchannel/data lane-specific timing associated with that error result is adjusted accordingly, in the present example by adjusting the value of the Phase Interpolator 390 for that subchannel.

Figure 4A:
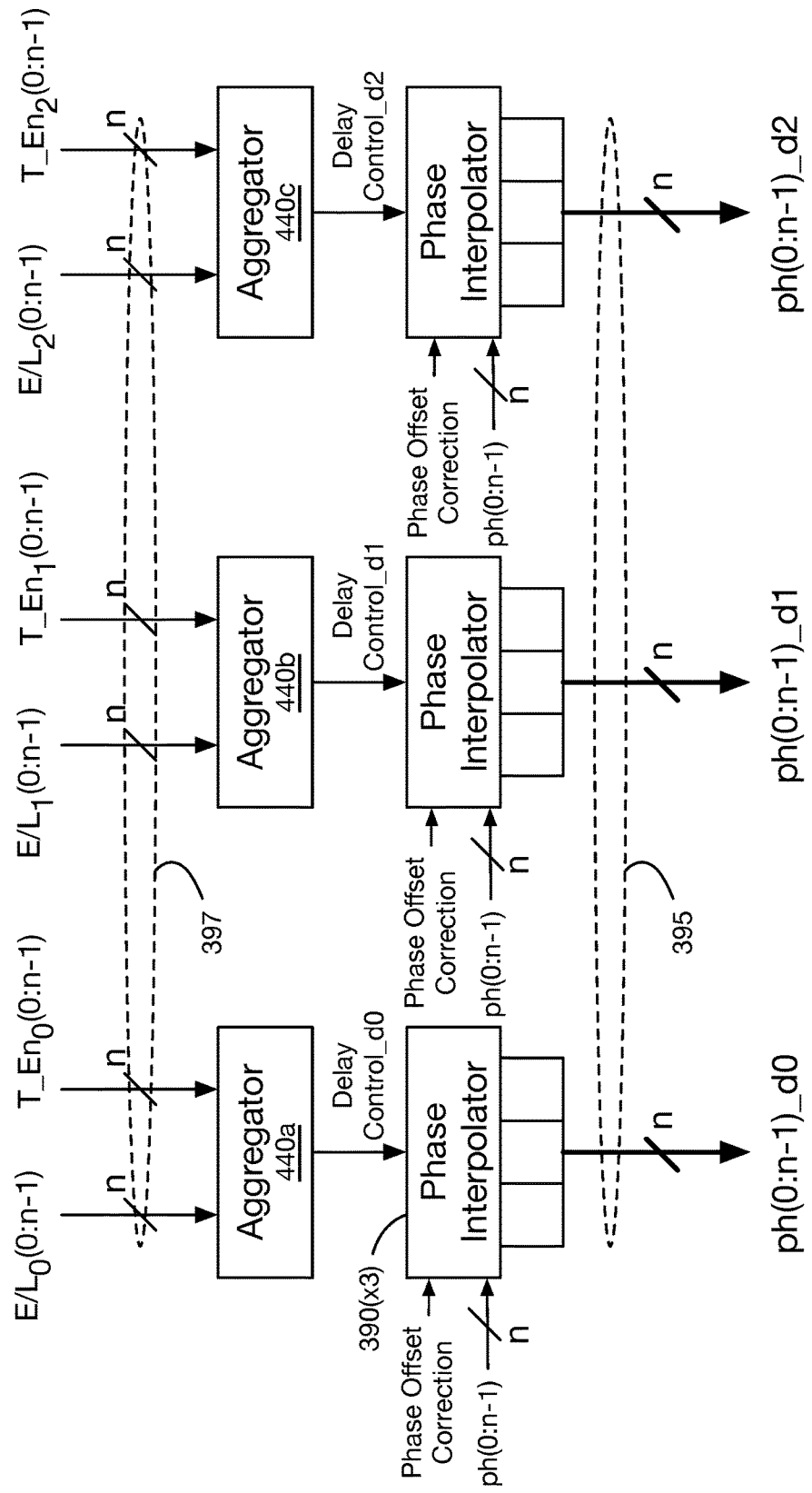
FIG. 4A is a block diagram of data lane-specific phase interpolators applying data lane-specific delays to phases of a local oscillator signal, in accordance with some embodiments.
Figure 4B:
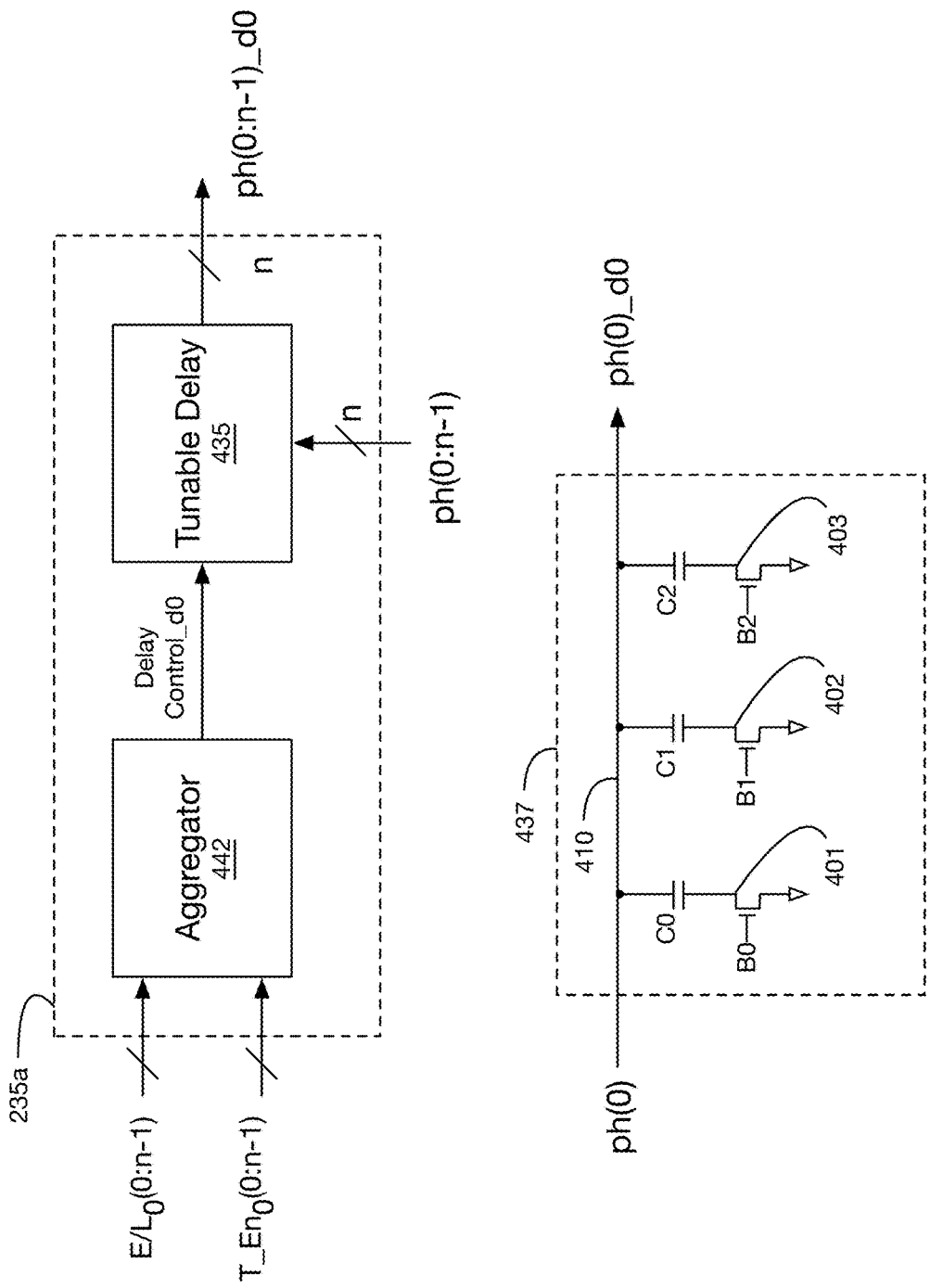
FIG. 4B is a block diagram of a data lane-specific delay element for applying a data lane-specific delay to a phase of a local oscillator signal, in accordance with some embodiments.

A combination of phase error aggregators 490a/b/c and the three data lane-specific phase interpolators 390 producing data lane-specific adjusted sampling clocks as described above is detailed in FIG. 4A. In such an embodiment, the aggregators analyze the data-derived phase-error signals to determine if the average phase error in a given data lane is 0. If the average phase error of data lane '0' is not 0, the phases of the sampling clock ph(0:n−1) are interpolated with the data lane-specific delay value d0 determined by the Delay Control_d0 signal provided by aggregator 440a. After an adjustment is made, the average composite phase-error signal may no longer be 0, and the error aggregator may update the VCO accordingly. Such a process may repeat until (i) the average phase error of each data lane is 0 and (ii) the average composite phase error signal is 0. Alternative embodiments may incorporate other mechanisms enabling control of individual data lane sampling clocks, independent from the overall phase lock maintained by the PLL. FIG. 4B illustrates one such alternative embodiment, wherein aggregator 442 produces a Delay Control_d0 according to the average error on data lane 0 which adjusts Tunable Delay element 435 to apply the data lane-specific delay values to the phases(0:n−1) of the sampling clock. The relative phase of one or more of local clock signals ph(0:n−1), modified by the data lane-specific delay value of the Tunable Delay 435, results in a phase adjusted data lane sampling clock(s) ph(0:n−1)_d0. Equivalent instances of 235a may be similarly provided for each additional data lane, allowing the phase of the local oscillator signal used for generating each data-derived phase-error signal for a given data lane to be delayed by a data lane-specific delay value.

Another embodiment may additionally incorporate a plurality of data lane-specific error aggregators 442, each data lane-specific aggregator 442 configured to receive data-driven phase-error signals associated with an associated data lane and to responsively determine a respective data lane-specific control signal indicative of the data lane-specific delay value. Other embodiments may be further composed of data lane-specific phase interpolators as shown in FIG. 4A, each data lane-specific phase interpolator configured to receive a corresponding data lane-specific delay control signal and the one or more phases of the local oscillator signal, and to responsively interpolate the one or more phases of the local oscillator according to the data lane-specific delay value.

In some embodiments, producing an adjustable digital signal delay suitable for phase adjustment is done by the switched capacitive node loading embodiment of FIG. 4B. Digital control values B0, B1, B2 enable switching transistors 401, 402, 403 which add capacitive loads C0, C1, C2 to signal node 410. Further embodiments may additionally incorporate series resistance or inductance to increase the delaying effects of the selectable capacitive loading.

In general, the relative sample timing or sampling phase for a given data lane will be the same in each processing phase of all parallel processing phases, albeit in consecutive receive unit intervals. Further embodiments may permit incremental phase adjustments to be made between processing phases, as one example to compensate for inherent timing differences caused by clock distribution variations among the various processing instances.

Overall phase lock is maintained by phase-error aggregator 240 configured to obtain a plurality of data-derived phase-error signals for two or more data lanes of a multi-wire bus, each data-derived phase-error signal generated using at least a phase of one or more phases of a local oscillator signal and a corresponding data signal associated with one of the two or more data lanes, the phase-error aggregator 240 configured to responsively generate a composite phase-error signal representing a combination of the two or more obtained data-derived phase-error signals. This phase-error signal is filtered by a loop filter 245 configured to receive the composite phase-error signal and to responsively generate an oscillator control signal for adjusting local oscillator 250. Local oscillator 250 receives the oscillator control signal and responsively adjusts a timing of the local oscillator to adjust the one or more phases of the local oscillator signal.

Figure 9:
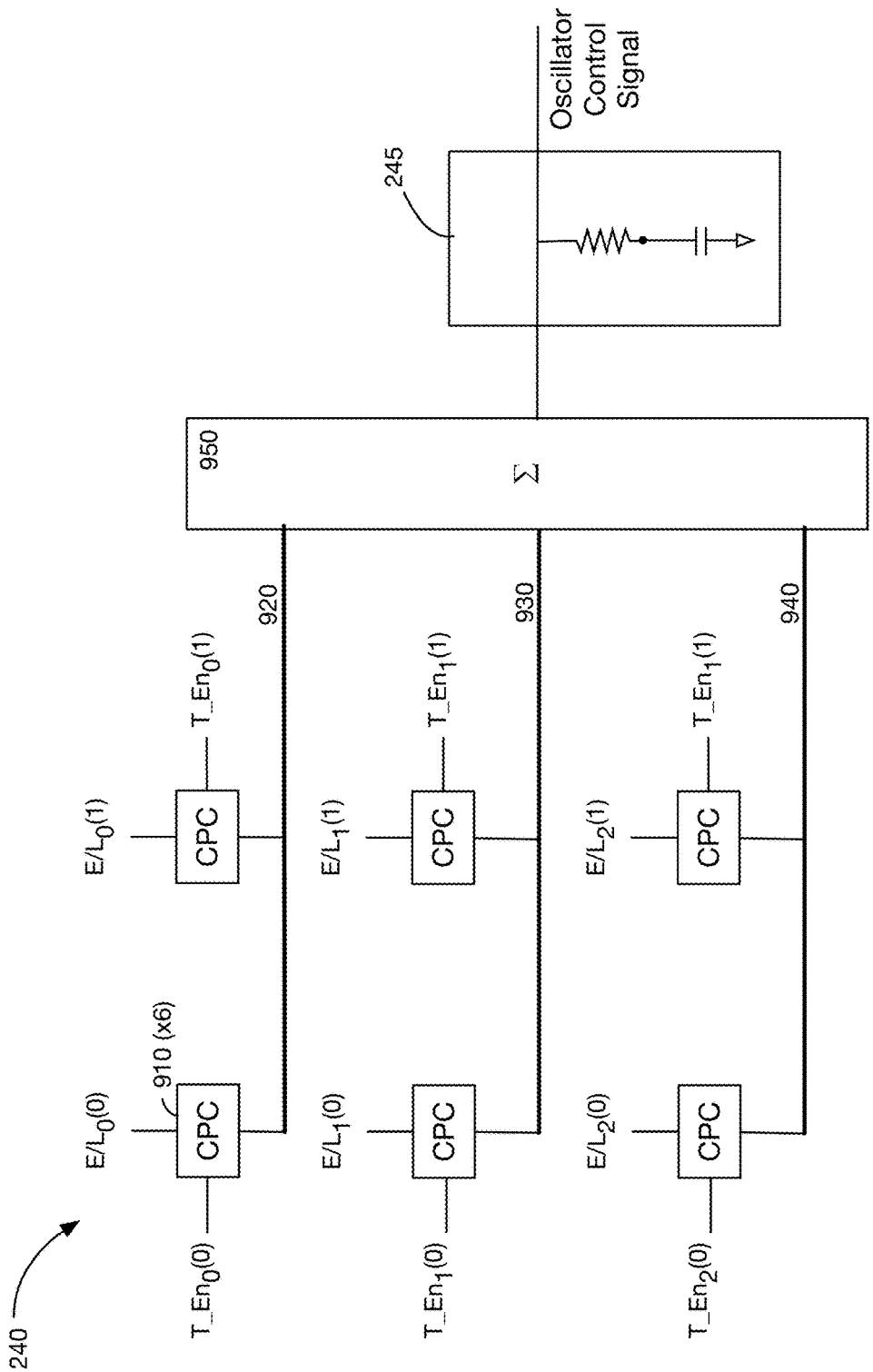
FIG. 9 is a block diagram of an analog phase-error aggregator, in accordance with some embodiments.

The aggregation of phase error may be performed in the analog or the digital domain. The embodiment of FIG. 9 is an example of analog phase-error aggregation, with early/late indications resulting in pump up/pump down actions by one or more charge pumps on a storage capacitor, with the resulting capacitor voltage corresponding to the aggregated analog phase-error signal output. In this particular embodiment, transition indication signals T_En enable or disable charge pump (CPC) action, while early-late indication signals E/L tell the charge pump to pump up or down, if it is enabled. The aggregation is illustrated as occurring across three data streams being detected in two parallel processing phases, neither of which implies limitation.

Figure 10:
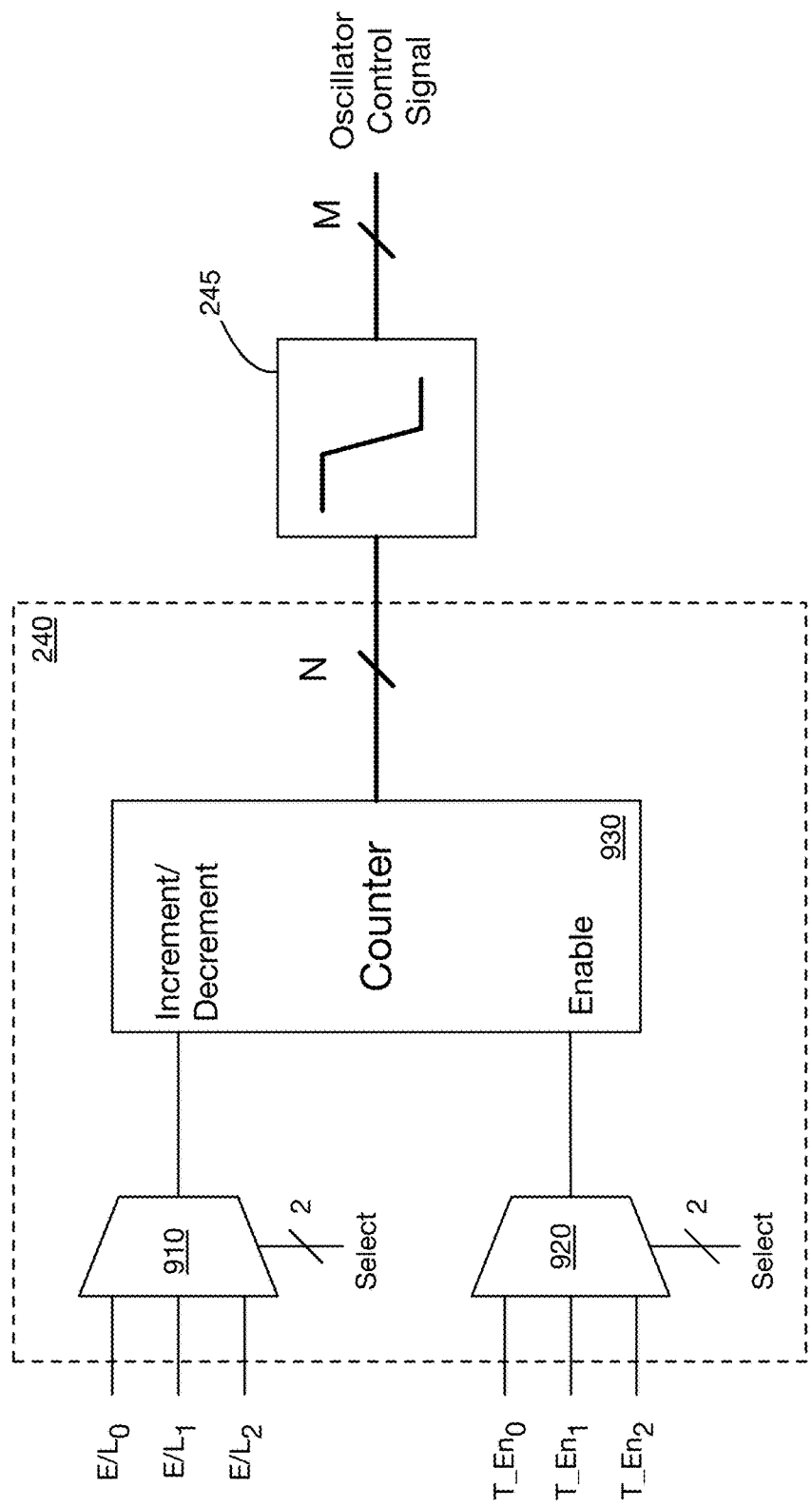
FIG. 10 is a block diagram of a digital phase-error aggregator utilizing a pipelining circuit and a counter, in accordance with some embodiments.
Figure 11:
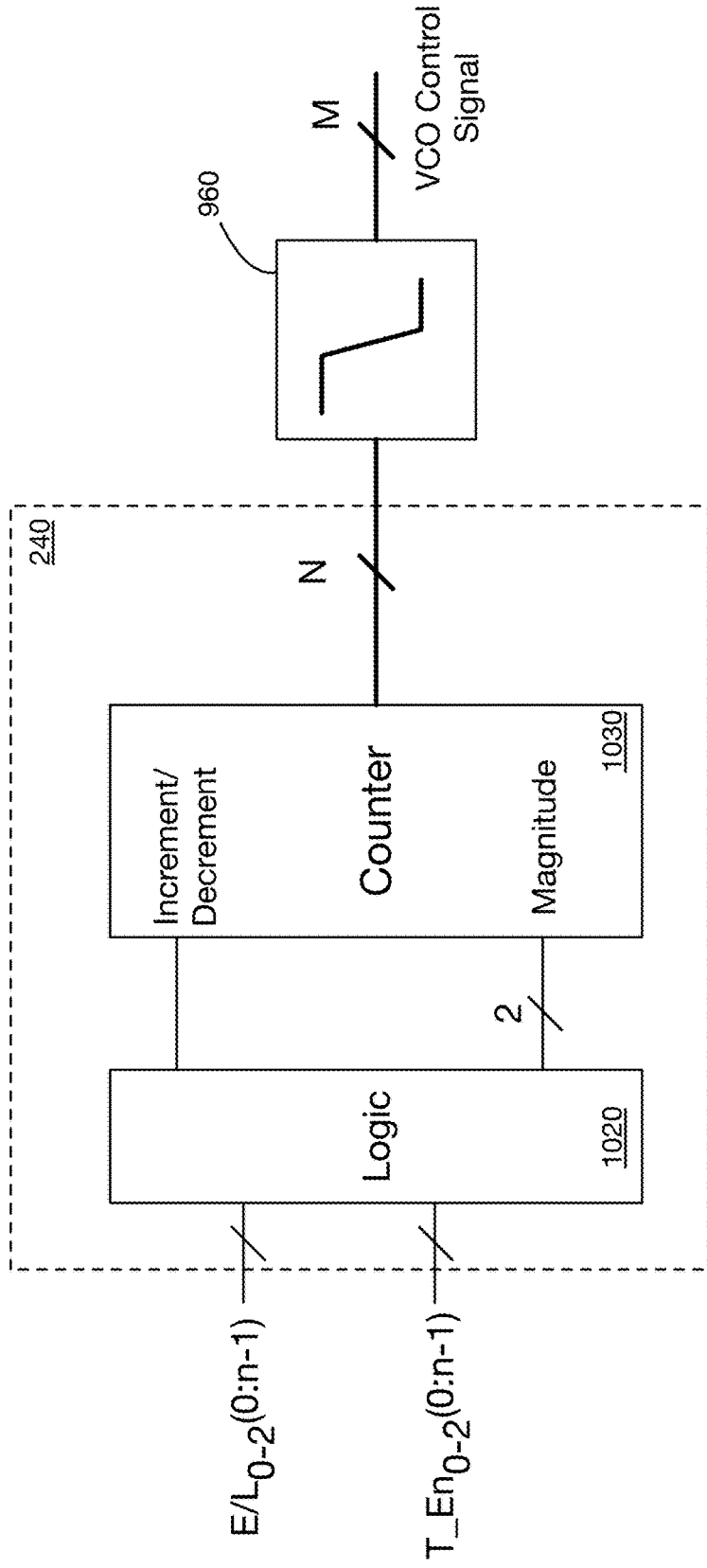
FIG. 11 is a block diagram of a digital phase-error aggregator utilizing a phase-error combiner and a counter, in accordance with some embodiments.

FIGS. 10 and 11 show two digital phase error aggregation embodiments producing a digital composite phase-error signal output. In FIG. 10, a digital multiplexor 910 pipelines the Early/Late indication signals from the three data lanes, as digital multiplexor 920 concurrently pipelines the transition indication signal associated with each data lane to counter 930. As the Select signal cycles the multiplexors through all data lanes, counter 930 is incremented for each data lane where T_En is active (and thus counter 930 enabled,) and E/L is high (Early); counter 930 is decremented for each data lane where T_En is active and E/L is low (Late). Alternatively, the counter may be decremented/incremented if E/L is early/late, respectively. Thus, the N bit digital total count held by counter 930 represents the historic summation of all valid Early/Late indications over all data lanes. In some embodiments, additional low pass filtering 245 is be applied to the total count using a digital filter to produce an M-bit digital Oscillator control signal. In some embodiments, M=N, but may be larger or smaller in some embodiments. In the alternative digital embodiment of FIG. 11, each data lane provides not a single bit Early/Late indication, but a numerical value indicating both direction and magnitude of the phase error across the multiple data lanes. Operation is similar to that of the previous example, except that counter 1030 may increase or decrease in value by a magnitude determined by the numeric value of the aggregate phase error in each phase. Table I below provides some numerical examples for combining data-derived phase error signals in which an E/L signal has a value of 1=early and −1=late if the corresponding T_En signal indicates a transition occurred, and wherein an E/L signal is not applicable if the corresponding T_En signal indicates no transition occurred:

TABLE I

| $E/L_0$ | $E/L_1$ | $E/L_2$ | Summation | Magnitude | Up = + sign Down = − sign |
|---|---|---|---|---|---|
| −1 | 1 | 1 | 1 | 1 | Up |
| N/A | 1 | 1 | 2 | 2 | Up |
| −1 | N/A | 1 | 0 | 0 | No Change |
| −1 | N/A | N/A | −1 | 1 | Down |

As mentioned above, in Table I, each data lane D0-D2 has an early late value of '1' or '−1', and is only used in the combination if there was a verified transition (e.g., using transition indication signals $T\_En_{0-2}$). If there was no transition, then the corresponding E/L value is 'N/A'. The E/L values having verified transitions of the three lanes are combined, and the counter is incremented up or down according to the sign of the summation by a magnitude of the summation. In the first row, data lane 0 is late while data lanes 1 and 2 are early, and thus the counter is incremented by a magnitude of 1. It should be noted that in some embodiments, the counter may increment or decrement in opposite directions as the example above. It should also be noted that in some embodiments, the E/L signals provided by the samplers may always be combined. In such embodiments, the received information may correspond to a test pattern, or the received information may be designed to have a sufficient transition density such that the erroneous E/L signals are effectively overridden by E/L signals that did in fact have transitions.

Equivalent digital phase aggregator embodiments may implement all or some of the selection or Logic functions 910, 920, 1120 as programmed logical instructions, and all or some of the counter 930, 1030 functions as programmed arithmetic instructions, executed by a computer processor or programmed logic element.

Figure 12:
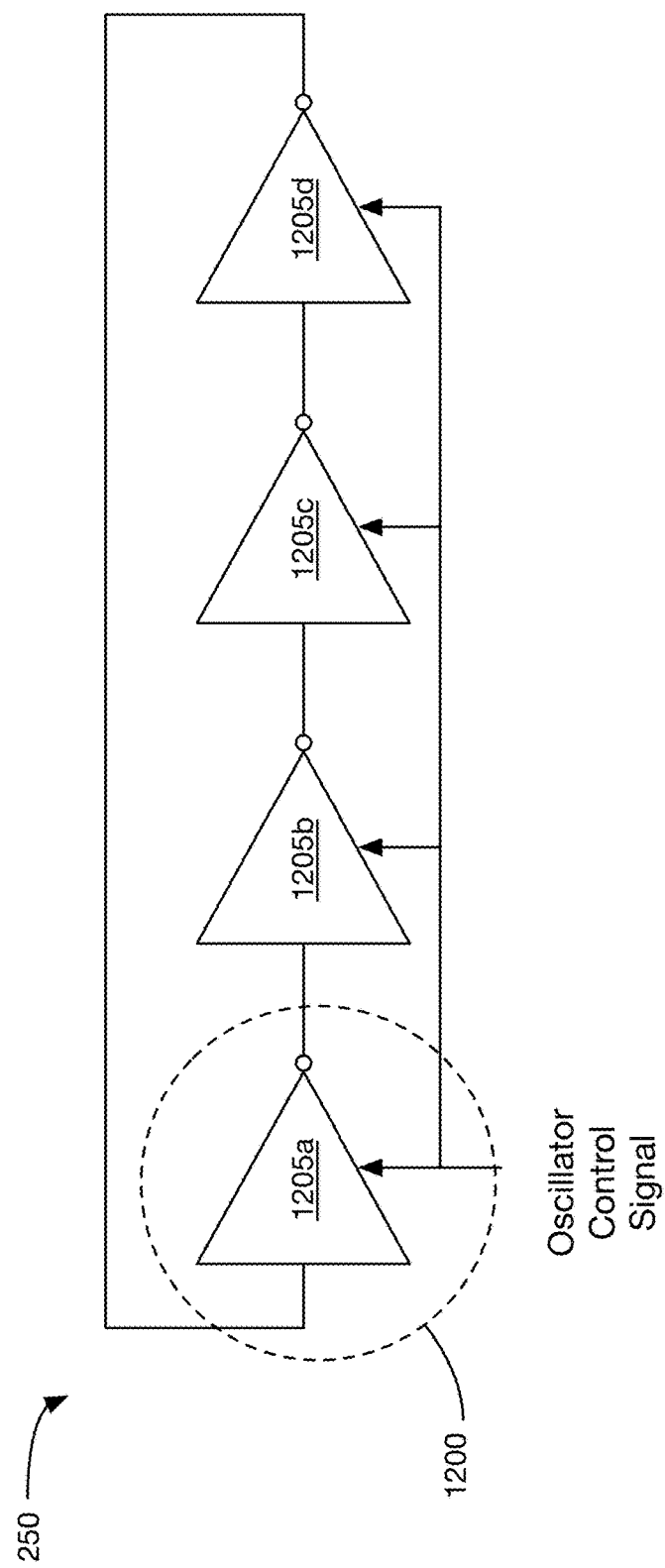
FIG. 12 is a block diagram of a ring oscillator, in accordance with some embodiments.
Figure 13A:
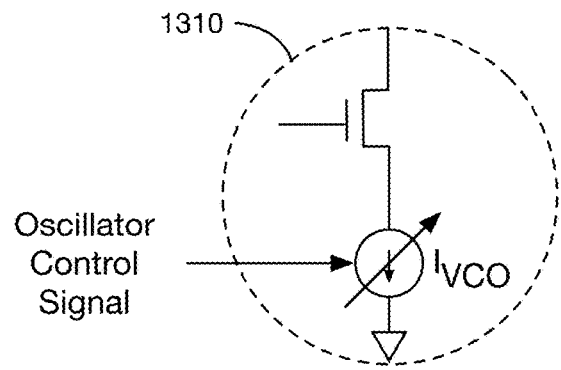
FIG. 13A is a block diagram of an analog tunable current source, in accordance with some embodiments.
Figure 13B:
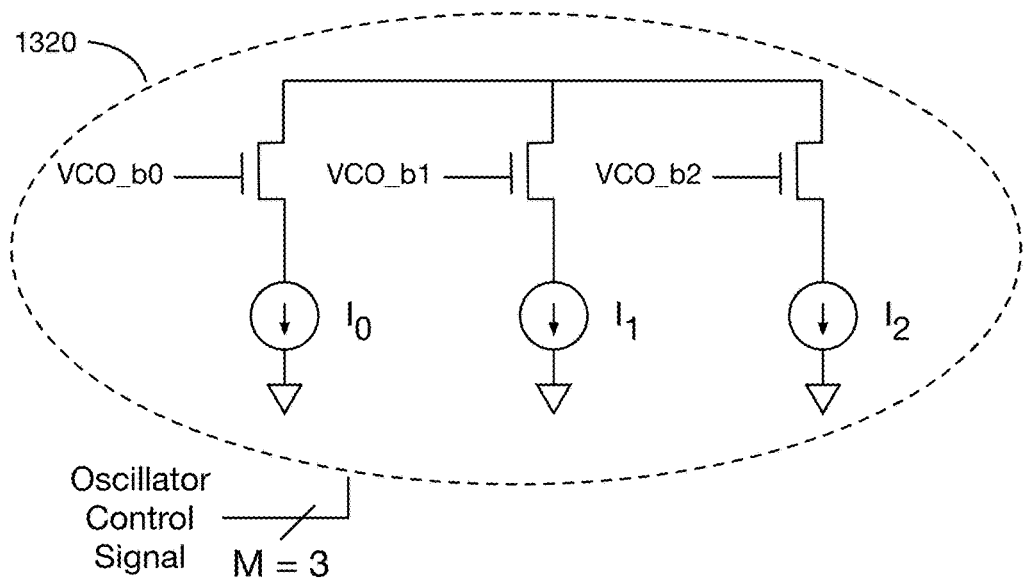
FIG. 13B is a block diagram of a digital tunable current source, in accordance with some embodiments.

One embodiment of a voltage control oscillator is shown in the ring oscillator of FIG. 12. A ring oscillator may incorporate any number of amplifier or digital logic gates in a closed loop; the base oscillation period is 2 times the total propagation delay around the loop, and the loop contains an odd number of signal inversions. To enable analog control of oscillation frequency, the propagation time of one or more (preferably all) loop elements is adjustable. Such adjustment may be composed of adjustment of supply current in a logic stage as shown in FIG. 13A, adjustment of capacitive node loading as shown in FIG. 4B, adjustment of switching threshold voltages, or other means. The simple digital-to-analog converter of FIG. 13B provides one means of performing the current adjustment of FIG. 13A; the switching transistors may be dimensionally scaled to provide predetermined current increments, and the controlling signals enabling said transistors may be organized as a thermometer (linear counting) code, a binary code, or in other desirable form.

Figure 14:
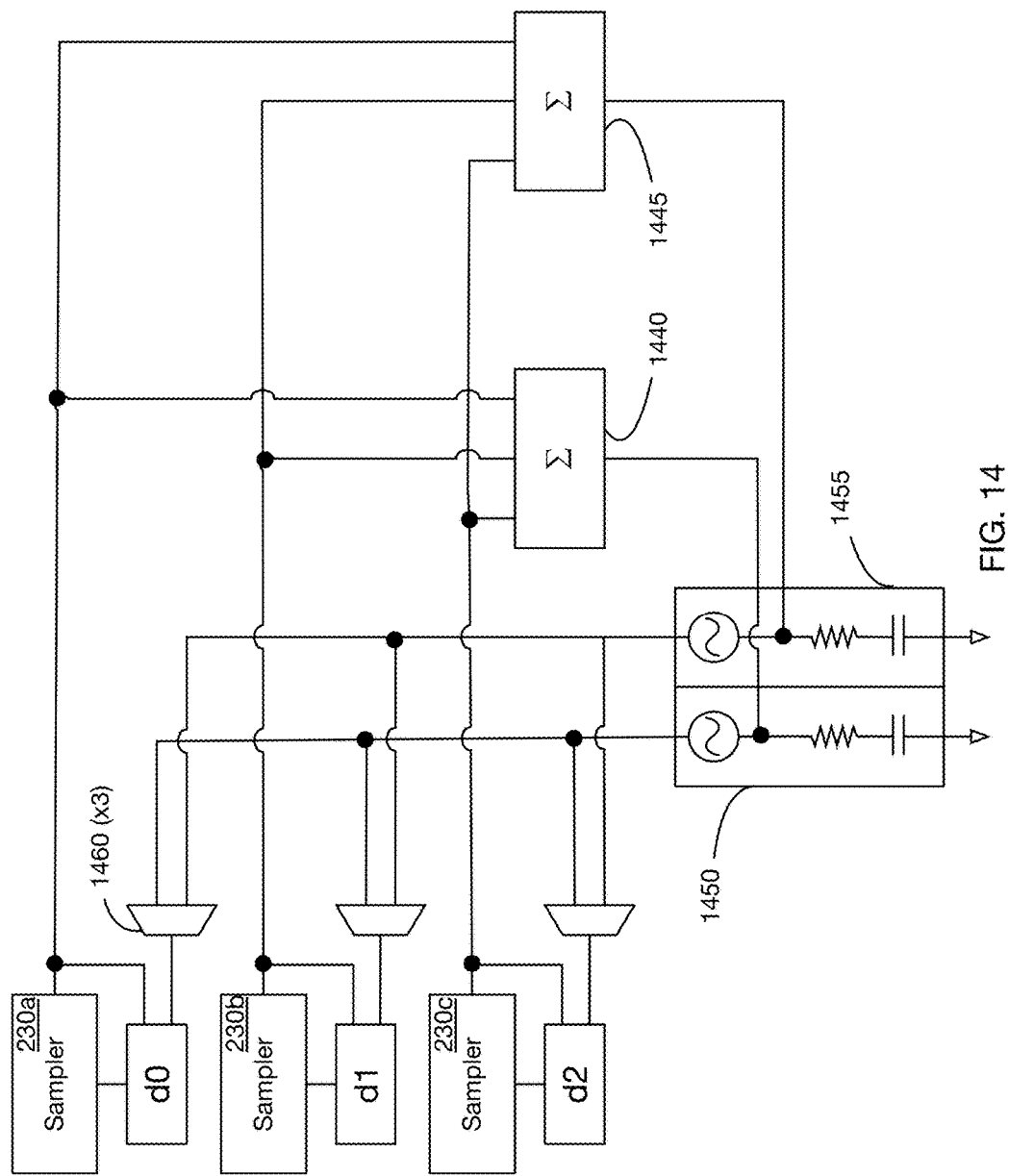
FIG. 14 is a block diagram of a multi-modal vote-sharing circuit, in accordance with some embodiments.

FIG. 14 shows a further embodiment of a digital signal receiver configurable to operate in multiple functional modes. Such an embodiment incorporates more than one aggregation element, as in 1440 and 1445, as well as multiple clock generation PLLs, as in 1450 and 1455 generating at least a first and a second local timing reference. Each of the multiple data stream inputs may be sampled based on timing derived from a selected one of the local timing standards, as illustrated by the selection multiplexors 1460.

In a first operational mode, two or more of the signal inputs are elements of a common signal group and clocking domain, as one example utilizing ODVS H4 encoding. In this mode, timing for each input of the common signal group is derived from the same local timing reference. As previously described herein, optional phase offsets may be provided to incrementally adjust individual input samplers to compensate for inherent timing offsets such as differing signal propagation delays.

In a second operational mode, the various signal inputs are members of at least two distinct signal groups, which may derive from different clocking domains. The at least first and second local clock sources enable independent sampling intervals to be maintained, separately locked to those distinct input clocks.

In a third operational mode, two or more of the signal inputs may be derived from a common clocking domain, but with sufficiently intractable propagation time variations to preclude satisfactory reception in the first operational mode. The at least first and second local clock sources are simultaneously used to produce isochronous clocks, equivalent in frequency but differing (potentially variably) in phase, each synchronized to a different one of the two or more signal inputs. In an alternative mode in which the two or more signal inputs are derived from a common clocking domain, a single local clock source e.g., 1450 may be used, and the data lane-specific delay value may be applied to the generated sampling clock via data lane-specific delay elements d0-2 to compensate for propagation time variations.

Figure 18:
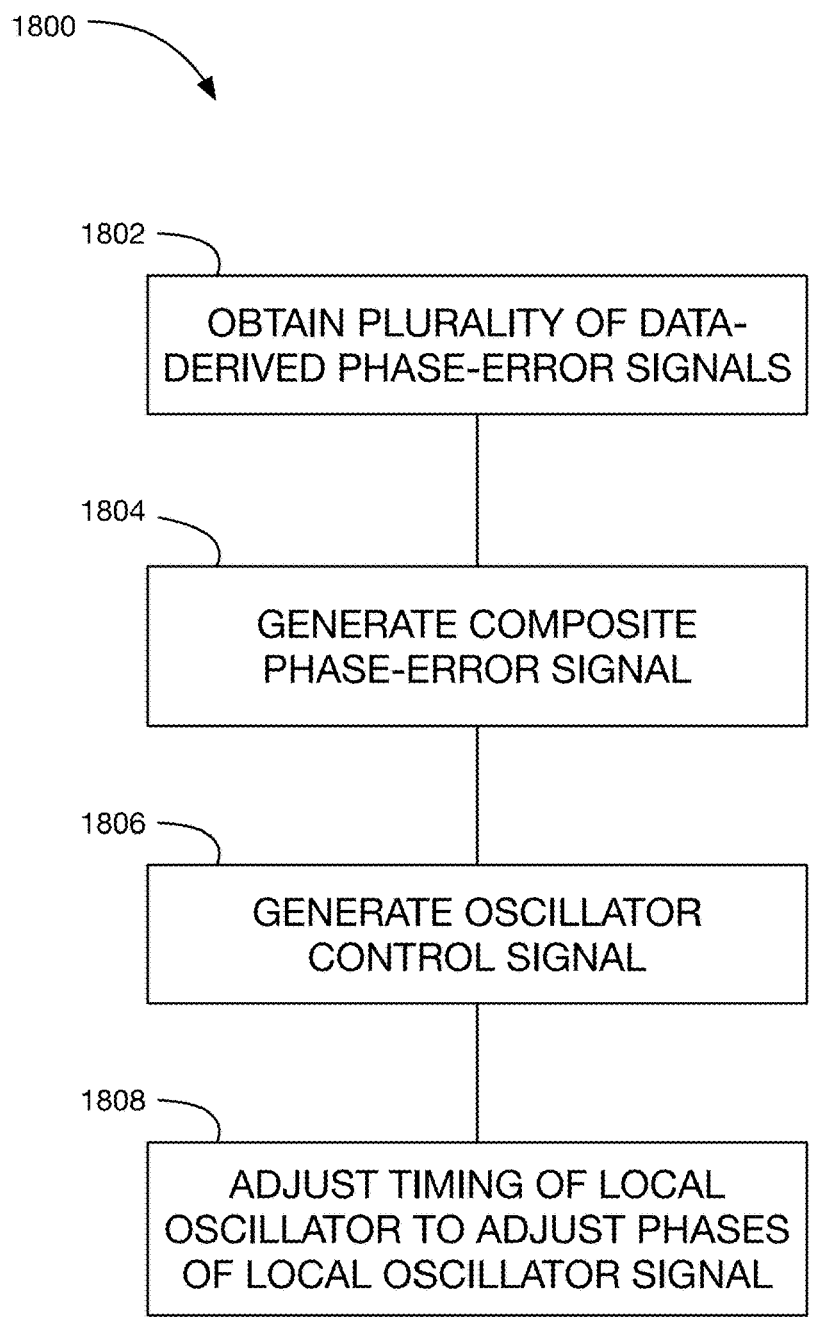
FIG. 18 is a flowchart of a method, in accordance with some embodiments.

FIG. 18 illustrates a method performed by a further embodiment comprising obtaining 1802, at a phase-error aggregator, a plurality of data-derived phase-error signals for two or more data lanes of a multi-wire bus, each data-derived phase-error signal generated using at least (i) a phase of one or more phases of a local oscillator signal and (ii) a corresponding data signal associated with one of the two or more data lanes; generating 1804 a composite phase-error signal representing a combination of the two or more obtained data-derived phase-error signals; receiving the composite phase-error signal at a loop filter responsively generating 1806 an oscillator control signal; and receiving the oscillator control signal at a local oscillator and responsively adjusting 1808 a timing of the local oscillator to adjust the one or more phases of the local oscillator signal.

Each data-derived phase-error signal may be produced in response to a data sample and an edge sample of the data signal obtained according to one or more phases of the local oscillator signal, and a previous data sample. The previous data sample may be obtained from a data history or other storage element, or from a parallel processing phase operating on a previous time interval of the data signal.

As previously described relative to FIG. 5, the data-derived phase error signals may be generated using loop-unrolled or predictive DFE corrections. In one such embodiment, a pair of decision feedback equalization (DFE) coefficients are applied to the received data signal, generating a pair of DFE-corrected data samples. Using a data output value derived from a previous time interval of the data signal, one of said DFE-corrected data samples is selected as a data output, and the other of said DFE-corrected data samples is selected as the data-derived phase-error signal.

In some embodiments, the phase of the local oscillator signal used for generating each data-derived phase-error signal for a given data lane is delayed by a data lane-specific delay value. In a further embodiment, respective data lane-specific control signals indicative of the data lane-specific delay value are determined, each data lane-specific control signal generated using a plurality of data lane-specific error aggregators operating on respective data-driven phase-error signals from an associated data lane.

In some embodiments, the method of generating the composite phase-error signal comprises receiving, at a plurality of charge-pumps, the plurality of data-derived phase-error signals, and responsively generating a plurality of currents representing the data-derived phase-error signals; and combining, at a common analog summation node, the plurality of currents to generate the composite phase-error signal.

In some embodiments, the method of generating the composite phase-error signal comprises performing a digital combination of the plurality of data-derived phase-error signals.

In some embodiments, the data-derived phase-error signals that are determined to have had a transition in the corresponding data signal are combined to generate the composite phase-error signal.

The wire communication methods disclosed in this application are equally applicable to other communication media including optical and wireless communications. Descriptive terms such as voltage or signal level should be considered to include equivalent metrics such as current and charge. Similarly, specific examples provided herein are for purposes of description, and do not imply a limitation, in particular in regards to numbers of input signals, signal encoding, number of bits detected, etc.

As used herein, "physical signal" includes any suitable behavior and/or attribute of a physical phenomenon capable of conveying information. In accordance with at least one embodiment, physical signals may be tangible and non-transitory.

We claim:
1. An apparatus comprising:
 a plurality of sampling elements, each sampling element of the plurality of sampling elements configured to (i) receive a corresponding data signal and to responsively generate a pair of speculative DFE-corrected data samples by applying a pair of decision feedback equalization (DFE) coefficients to the corresponding data signal, the pair of speculative DFE-corrected data samples being generated at a sampling instant based on one or more phases of a local oscillator signal, (ii) select, based on a historical data sample, a first DFE-corrected data sample of the pair of DFE-corrected data samples as a data output, and a second DFE-corrected data sample of the pair of DFE-corrected data samples as a respective data-derived phase-error signal;
 a phase-error aggregator configured to obtain at least two respective data-derived phase-error signals from the plurality of sampling elements and to responsively generate a composite phase-error signal representing a combination of the at least two respective data-derived phase-error signals;
a loop filter configured to receive the composite phase-error signal and to responsively generate an oscillator control signal; and
a local oscillator configured to receive the oscillator control signal and to responsively adjust a timing of the local oscillator to adjust the one or more phases of the local oscillator signal.

2. The apparatus of claim 1, wherein the historical data sample is obtained from a data history storage element.

3. The apparatus of claim 1, wherein the historical data sample is obtained from a sampling element of a parallel processing phase.

4. The apparatus of claim 1, wherein the composite phase-error signal is an analog composite phase-error signal, and wherein the phase-error aggregator comprises:
a plurality of charge-pumps, each charge pump configured to receive a respective data-derived phase-error signal of the plurality of data-derived phase-error signals, the plurality of charge pumps configured to responsively generate a plurality of currents representing the data-derived phase-error signals; and
a common analog summation node configured to combine the plurality of currents to generate the analog composite phase-error signal.

5. The apparatus of claim 1, wherein the composite phase-error signal is a digital composite phase-error signal, and wherein the phase-error aggregator comprises a combiner configured to receive the data-derived phase-error signals and to responsively generate the digital composite phase-error signal.

6. The apparatus of claim 1, wherein the local oscillator comprises a plurality of inverter stages, wherein the oscillator control signal is configured to adjust a delay value in each inverter stage, wherein each inverter stage comprises a tunable current source configured to provide an operating current corresponding to the delay value, wherein the delay value is adjusted by adjusting a magnitude of the tunable current source.

7. The apparatus of claim 1, wherein the phase-error aggregator is configured to combine data-derived phase-error signals that are determined to have had a transition in the corresponding data signal.

8. The apparatus of claim 1, further comprising:
a plurality of data lane-specific error aggregators, each data lane-specific aggregator associated with a respective data lane and configured to receive data-driven phase-error signals associated with the respective data lane, each data lane-specific aggregator configured to responsively determine a respective data lane-specific control signal indicative of a data lane-specific delay value associated with the respective data lane;
a plurality of data lane-specific delay elements, each data lane-specific delay element associated with a respective data lane and configured to receive the data lane-specific control signal associated with the respective data lane, each data lane-specific delay element configured to delay the phase of the local oscillator signal used for generating each data-derived phase-error signal for the respective data lane by the associated data lane-specific delay value.

9. A method comprising:
receiving corresponding data signals at a plurality of sampling elements;
generating, for each corresponding data signal, a pair of speculative DFE-corrected data samples by applying a pair of decision feedback equalization (DFE) coefficients to the corresponding data signal, the pair of speculative DFE-corrected samples generated at a sampling instant according to a phase of one or more phases of a local oscillator signal;
selecting, based on a historical data sample, a first DFE-corrected data sample of the pair of DFE-corrected data samples as a data output, and a second DFE-corrected data sample of the pair of DFE-corrected data samples as a respective data-derived phase-error signal;
obtaining, at a phase-error aggregator, at least two respective data-derived phase-error signals;
generating a composite phase-error signal representing a combination of the at least two respective data-derived phase-error signals;
receiving the composite phase-error signal at a loop filter responsively generating an oscillator control signal; and
receiving the oscillator control signal at a local oscillator and responsively adjusting a timing of the local oscillator to adjust the one or more phases of the local oscillator signal.

10. The method of claim 9, wherein the historical data sample is obtained from a data history element.

11. The method of claim 9, wherein the historical data sample is obtained from a sampling element in a parallel processing phase.

12. The method of claim 9, wherein the phase of the local oscillator signal used for generating each data-derived phase-error signal for a given data lane is delayed by a data lane-specific delay value.

13. The method of claim 9, further comprising determining respective data lane-specific control signals indicative of the data lane-specific delay value, each data lane-specific control signal generated using a respective data lane-specific error aggregator operating on respective data-driven phase-error signals from an associated data lane.

14. The method of claim 9, generating the composite phase-error signal comprises:
receiving, at a plurality of charge-pumps, the plurality of data-derived phase-error signals, and responsively generating a plurality of currents representing the data-derived phase-error signals; and
combining, at a common analog summation node, the plurality of currents to generate the composite phase-error signal.

15. The method of claim 9, wherein generating the composite phase-error signal comprises performing a digital combination of the plurality of data-derived phase-error signals.

16. The method of claim 9, wherein data-derived phase-error signals having been determined to have had a transition in the corresponding data signal are combined to generate the composite phase-error signal.

* * * * *